US011397208B2

United States Patent
Zhou et al.

(10) Patent No.: US 11,397,208 B2
(45) Date of Patent: Jul. 26, 2022

(54) INFRARED ZERO VALUE DIAGNOSIS METHOD AND SYSTEM FOR PORCELAIN INSULATOR STRING

(71) Applicants: State Grid Hubei Electric Power Research Institute, Hubei (CN); Hunan University, Hunan (CN)

(72) Inventors: Xueming Zhou, Hubei (CN); Danhui Hu, Hubei (CN); Xiaopo Mao, Hubei (CN); Jungang Yin, Hunan (CN); Jianjin Fu, Hubei (CN); Zhiqiang Feng, Hubei (CN); Yaodong Zhang, Hubei (CN); Zeqi Huang, Hubei (CN); Tianru Shi, Hubei (CN)

(73) Assignees: State Grid Hubei Electric Power Research Institute, Wuhan (CN); Hunan University, Changsha (CN)

( * ) Notice: Subject to any disclaimer, the term of this patent is extended or adjusted under 35 U.S.C. 154(b) by 0 days.

(21) Appl. No.: 17/276,480

(22) PCT Filed: Dec. 31, 2020

(86) PCT No.: PCT/CN2020/142016
§ 371 (c)(1),
(2) Date: Mar. 15, 2021

(87) PCT Pub. No.: WO2021/190056
PCT Pub. Date: Sep. 30, 2021

(65) Prior Publication Data
US 2022/0113343 A1    Apr. 14, 2022

(30) Foreign Application Priority Data

Mar. 26, 2020  (CN) .......................... 202010225404.6

(51) Int. Cl.
*G01R 31/00*     (2006.01)
*G01R 31/12*     (2020.01)

(52) U.S. Cl.
CPC ..... *G01R 31/1218* (2013.01); *G01R 31/1245* (2013.01)

(58) Field of Classification Search
CPC .. G01R 31/1218; G01R 31/1245; G01N 3/60; G01N 17/006; G01N 25/72
See application file for complete search history.

(56) References Cited

U.S. PATENT DOCUMENTS 5,647,667 A * 7/1997 Bast ....................... G01N 25/72
374/57
6,542,849 B2 * 4/2003 Sun ....................... G01B 11/06
702/170

(Continued)

FOREIGN PATENT DOCUMENTS

CN    107767374 A    3/2018

OTHER PUBLICATIONS

Youwei Zhou et al., Infrared Image Detection for Faulty Insulators Based on Time Series Model, Insulators and Surge Arresters, Feb. 25, 2020, pp. 149-155, No. 1.

(Continued)

*Primary Examiner* — Thang X Le

(57) ABSTRACT

An infrared zero value diagnosis method and system for a porcelain insulator string are provided. The method includes: collecting an infrared thermogram of a to-be-diagnosed porcelain insulator string; extracting temperature of an iron cap of each insulator in the infrared thermogram of the to-be-diagnosed porcelain insulator string; calculating a temperature gradient value of each insulator in the to-be-diagnosed porcelain insulator string, drawing a temperature gradient distribution curve, and generating a temperature gradient distribution matrix of all to-be-diagnosed porcelain (Continued)

insulator strings; calculating a correlation coefficient of the temperature gradient distribution curve and a correlation coefficient of an average-value curve for each insulator string, and presenting the correlation coefficients in a scatter diagram; and performing comprehensive analysis and determining on the temperature gradient distribution curve, the temperature gradient distribution matrix of the to-be-diagnosed porcelain insulator strings, and the scatter diagram, to complete detection of the to-be-diagnosed porcelain insulator string.

11 Claims, 3 Drawing Sheets

(56) References Cited

U.S. PATENT DOCUMENTS

| | | | |
|---|---|---|---|
| 2010/0038544 A1* | 2/2010 | Shelley | G01N 21/3563 250/339.09 |
| 2016/0061758 A1* | 3/2016 | Nakatani | G01J 5/02 374/5 |
| 2017/0052070 A1* | 2/2017 | Marsh | G01S 17/06 |
| 2017/0356844 A1* | 12/2017 | Bleuler | H05K 7/20136 |

OTHER PUBLICATIONS

International Search Report of PCT Patent Application No. PCT/CN2020/142016 dated Apr. 2, 2021.
Application rules of infrared diagnosis for live electrical equipment, Electric Power Industry Standard of the People's Republic of China, Dec. 5, 2016, DL/T 664-2016.

\* cited by examiner

```
┌─────────────────────────────────────────────────────────┐
│  Collect an infrared thermogram of a to-be-diagnosed    │
│                porcelain insulator string               │
└─────────────────────────────────────────────────────────┘
                            │
                            ▼
┌─────────────────────────────────────────────────────────┐
│ Extract temperature of an iron cap of each insulator in │
│  the infrared thermogram of the to-be-diagnosed         │
│              porcelain insulator string                 │
└─────────────────────────────────────────────────────────┘
                            │
                            ▼
┌─────────────────────────────────────────────────────────┐
│ Calculate a temperature gradient value of each insulator│
│ in the to-be-diagnosed porcelain insulator string based │
│ on the temperature of the iron cap of each insulator,   │
│ draw a temperature gradient distribution curve and an   │
│ average-value curve, and generate a temperature gradient│
│ distribution matrix of all to-be-diagnosed porcelain    │
│                    insulator strings                    │
└─────────────────────────────────────────────────────────┘
                            │
                            ▼
┌─────────────────────────────────────────────────────────┐
│ Calculate a correlation coefficient of the temperature  │
│ gradient distribution curve and a correlation           │
│ coefficient of the average-value curve for each         │
│ insulator string, and present the correlation           │
│         coefficients in a scatter diagram               │
└─────────────────────────────────────────────────────────┘
                            │
                            ▼
┌─────────────────────────────────────────────────────────┐
│ Perform comprehensive analysis and determining on the   │
│ temperature gradient distribution curve, the temperature│
│ gradient distribution matrix of the to-be-diagnosed     │
│ porcelain insulator strings, and the scatter diagram,   │
│ to complete infrared zero value diagnosis for the       │
│       to-be-diagnosed porcelain insulator string        │
└─────────────────────────────────────────────────────────┘
```

FIG. 1

INFRARED ZERO VALUE DIAGNOSIS METHOD AND SYSTEM FOR PORCELAIN INSULATOR STRING

TECHNICAL FIELD

The present disclosure relates to the technical field of detection of porcelain insulators in transformer substations and transmission lines, and specifically, to an infrared zero value diagnosis method and system for a porcelain insulator string.

BACKGROUND

As a type of important electrical insulating device, porcelain insulators are widely applied in transmission lines of different voltage grades and transformer substations. In a long-term running process, an insulator string may be easily deteriorated, for example, a low value or a zero value occurs, due to multiple complicated factors such as strong electromechanical load, acid rain, gale, icing, ultraviolet light, pollution, and drastic temperature and humidity changes. As a result, insulating performance of the insulator string is gradually worsened. A low-value or zero-value insulator may result in partial discharge, flashover, explosion and even string breakage, posing a great threat to safe and stable running of a power grid. For example, in recent years, serious insulator deterioration events have occurred in Jiangxi, Anhui, Gansu, Guangxi, and other places. Therefore, increasing attention has been paid to deterioration detection of in-service porcelain insulators.

At present, there are two types of low and zero value detection methods for porcelain insulators: coulometric detection methods and non-coulometric detection methods. The coulometric detection methods mainly include a spark gap-based detection method, an insulating resistance-based detection method, a voltage distribution-based detection method, a current leakage-based detection method, and the like. These methods are characterized by difficult manual operations, high risks, and low efficiency, and may easily cause incorrect detection and missing detection. The non-coulometric detection methods mainly include an infrared thermography method, an ultraviolet imaging method, an ultrasonic method, and the like. The infrared thermography method is the most frequently used contactless live detection method. In the infrared thermography method, determining is performed based on different temperature rising characteristics of iron caps of a deteriorated insulator and an adjacent normal insulator (this method is based on a threshold of a temperature difference between iron caps). Currently, in an on-site operation and maintenance process, a temperature difference of 1K and a temperature difference of −1K specified for the iron caps in the power industry standard DL/T 664-2016 *Application Rules of Infrared Diagnosis for Live Electrical Equipment* are widely used as bases for infrared detection of the low-value insulator and the zero-value insulator respectively. Temperature rising rules and infrared characteristics of the low-value insulator and the zero-value insulator are dynamic and complicated due to multiple environmental factors such as temperature, humidity, wind speed, air pressure, illuminance, and pollution. Therefore, infrared temperature measurement needs to be performed under a proper environment, in other words, is restricted by a detection window to a certain degree. For insulator temperature data measured on site, if low or zero value determining is performed only based on the temperature difference between the iron caps, incorrect detection and missing detection may be caused.

SUMMARY

The present disclosure aims to provide an infrared zero value diagnosis method and system for a porcelain insulator string, to perform comprehensive analysis and determining on a temperature difference between iron caps and temperature difference gradient correlation coefficients, thereby further improving accuracy of infrared zero value diagnosis for an insulator.

The present disclosure has the following technical solutions:

An infrared zero value diagnosis method for a porcelain insulator string includes the following specific steps:

collecting an infrared thermogram of a to-be-diagnosed porcelain insulator string;

extracting temperature of an iron cap of each insulator in the infrared thermogram of the to-be-diagnosed porcelain insulator string;

calculating a temperature gradient value of each insulator in the to-be-diagnosed porcelain insulator string based on the temperature of the iron cap of each insulator, drawing a temperature gradient distribution curve and an average-value curve, and generating a temperature gradient distribution matrix of all to-be-diagnosed porcelain insulator strings;

calculating a correlation coefficient of the temperature gradient distribution curve and a correlation coefficient of the average-value curve for each insulator string, and presenting the correlation coefficients in a scatter diagram; and performing comprehensive analysis and determining on the temperature gradient distribution curve, the temperature gradient distribution matrix of the to-be-diagnosed porcelain insulator strings, and the scatter diagram, to complete infrared zero value diagnosis for the to-be-diagnosed porcelain insulator string.

Before the extracting temperature of an iron cap of each insulator in the infrared thermogram of the to-be-diagnosed porcelain insulator string, the method further includes: performing preprocessing such as background subtraction, image denoising, and image enhancement on the collected infrared thermogram of the to-be-diagnosed porcelain insulator string.

The calculating a temperature gradient value of each insulator in the to-be-diagnosed porcelain insulator string specifically includes:

numbering each insulator in the to-be-diagnosed porcelain insulator string; and calculating a temperature gradient value of the $n^{th}$ insulator according to the following formula:

$$|\nabla T_n| = \beta \cdot \frac{T_{n+1} - T_n}{T_n + 273.15° \text{ C.}}$$

In the foregoing formula, $\beta$ represents a scaling factor, $\nabla T_1$ represents a temperature change gradient between two adjacent insulators, $T_{n+1}$ represents temperature of an iron cap of the $(n+1)^{th}$ insulator, $T_n$ represents temperature of an iron cap of the $n^{th}$ insulator, M is the number of insulators in the to-be-diagnosed porcelain insulator string, and $n=1, 2, 3, \ldots, M-1$.

The numbering each insulator includes: numbering, starting from a wire side, each insulator in the to-be-diagnosed porcelain insulator string, where the 1$^{st}$ insulator close to the wire side is numbered 1, and other insulators are numbered by analogy.

A value of the scaling factor β is 1000.

The correlation coefficient of the temperature gradient distribution curve and the correlation coefficient of the average-value curve are specifically calculated for each insulator string according to the following formula:

$$CORREL = \frac{Cov(X, Y)}{\sqrt{Var[X]Var[Y]}}$$

In the foregoing formula, Cov(X,Y) represents a covariance of a variable X and a variable Y, Var[X] represents a variance of X, and Var[Y] represents a variance of Y, in other words, $$CORREL = \frac{\sum_{i=1}^{n}(x_i - \bar{x})(y_i - \bar{y})}{\sqrt{\sum_{i=1}^{n}(x_i - \bar{x})^2 \sum_{i=1}^{n}(y_i - \bar{y})^2}}$$

In the foregoing formula, $x_i$ represents a sentinel value of the variable X, and i=1, 2, ... n; and $\bar{x}$ represents an average value of the variable X;

$y_i$ represents a sentinel value of the variable Y, and i=1, 2, ..., n; and $\bar{y}$ represents an average value of the variable Y; and when the correlation coefficient of the temperature gradient distribution curve is calculated, values of the variable X and the variable Y are obtained from the temperature gradient distribution curve; when the correlation coefficient of the average-value curve is calculated, the values of the variable X and the variable Y are obtained from the average-value curve.

The performing comprehensive analysis and determining on the temperature gradient distribution curve, the temperature gradient distribution matrix of the to-be-diagnosed porcelain insulator strings, and the scatter diagram includes: determining based on a threshold of a temperature difference between iron caps, and determining based on correlation coefficients of a porcelain insulator.

The determining based on a threshold of a temperature difference between iron caps includes: obtaining an absolute value of a temperature difference between insulators in each insulator string based on the temperature gradient distribution curve corresponding to the insulator string, and screening all the insulator strings to determine whether there is any low-value or zero-value insulator whose absolute value of a temperature difference is greater than a threshold.

The screening all the insulator strings is performed according to the standard DL/T 664-2016, and the threshold of the absolute value of the temperature difference is set to 1K according to the standard DL/T 664-2016.

The determining based on correlation coefficients of a porcelain insulator includes:

when a temperature gradient distribution curve of an insulator string contains a local sudden change, determining that an insulator corresponding to a position of the sudden change is a deteriorated insulator;

when a temperature gradient distribution curve of an insulator string contains no local sudden change, determining that all insulators in the insulator string are normal;

for an insulator string in which an absolute value of a temperature difference between insulators not at the end of the insulator string ranges from 0.3K to 1K, calculating correlation coefficients; and if the correlation coefficients constitute a strong correlation coefficient cluster and a weak correlation coefficient cluster, and a minimum distance between the two clusters is not less than 0.4, determining that the insulator string contains a deteriorated insulator; or for an insulator string in which an absolute value of a temperature difference between insulators not at the end of the insulator string is less than 0.3K, calculating correlation coefficients; and if the correlation coefficients are centralized in a scattered manner on the whole, are greater than 0.8, and constitute a strong correlation coefficient cluster, determining that the insulator string contains no deteriorated insulator.

An infrared feature correlation analysis system for a porcelain insulator string includes:

an infrared-thermogram collection module, configured to collect an infrared thermogram of a to-be-diagnosed porcelain insulator string;

an infrared-thermogram preprocessing module, configured to preprocess the collected infrared thermogram of the to-be-diagnosed porcelain insulator string, and extract temperature of an iron cap of each insulator in the infrared thermogram of the to-be-diagnosed porcelain insulator string;

a temperature gradient value calculation module, configured to calculate a temperature gradient value of each insulator in the to-be-diagnosed porcelain insulator string;

a curve drawing module, configured to draw a temperature gradient distribution curve and an average-value curve;

a correlation coefficient calculation module, configured to calculate a correlation coefficient of the temperature gradient distribution curve and a correlation coefficient of the average-value curve for each insulator string;

a presentation module, configured to present the temperature gradient distribution curve, the average-value curve, and a scatter diagram of the correlation coefficients; and an analysis and determining module, configured to perform comprehensive analysis and determining on the temperature gradient distribution curve, a temperature gradient distribution matrix of to-be-diagnosed porcelain insulator strings, and the scatter diagram, to complete detection of the to-be-diagnosed porcelain insulator string.

An existing infrared zero value detection technology for a porcelain insulator mainly relies on the temperature difference between the iron caps. However, the method is limited to local deterioration features, and excessively depends on naked eyes, thereby easily causing missing determining and incorrect determining. In the present disclosure, an infrared image is preprocessed, the temperature difference gradient value of the iron cap is calculated, the temperature difference gradient distribution curve and the average-value curve are drawn for the entire string, and comprehensive analysis and determining are performed on local and global temperature features through correlation analysis. This can effectively improve accuracy of infrared zero value diagnosis for the porcelain insulator. Compared with the prior art, the present disclosure has the following beneficial effects: comprehensive analysis and determining are performed on the temperature difference between the iron caps and the temperature difference gradient correlation coefficients. This further improves the accuracy of infrared zero value diagnosis for the insulator.

BRIEF DESCRIPTION OF THE DRAWINGS

FIG. 1 is a flowchart of a method according to the present disclosure;

DETAILED DESCRIPTION

Figure 2:
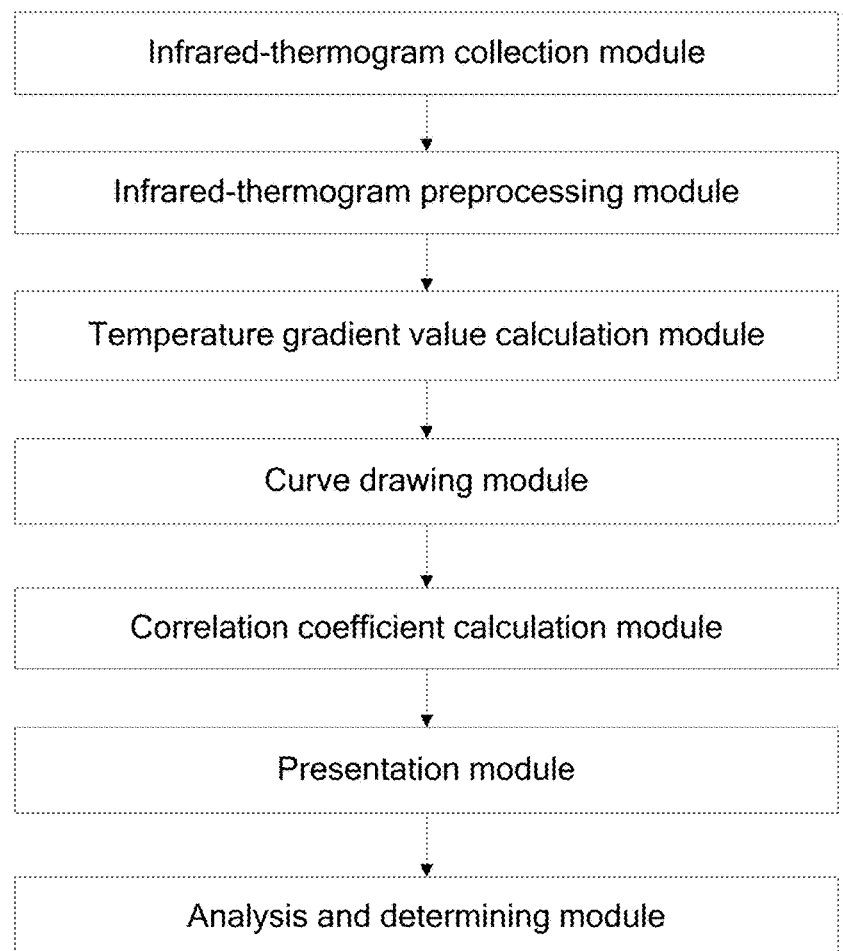
FIG. 2 is a block diagram of a system according to the present disclosure.

The following clearly and completely describes the technical solutions in the embodiments of the present disclosure with reference to accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

As shown in FIG. 1, an infrared zero value diagnosis method for a porcelain insulator string includes the following specific steps:

collecting an infrared thermogram of a to-be-diagnosed porcelain insulator string;

preprocessing the collected infrared thermogram of the to-be-diagnosed porcelain insulator string, and extracting temperature of an iron cap of each insulator in the infrared thermogram of the to-be-diagnosed porcelain insulator string;

calculating a temperature gradient value of each insulator in the to-be-diagnosed porcelain insulator string, drawing a temperature gradient distribution curve, and generating a temperature gradient distribution matrix of all to-be-diagnosed porcelain insulator strings;

calculating a correlation coefficient of the temperature gradient distribution curve and a correlation coefficient of an average-value curve for each insulator string, and presenting the correlation coefficients in a scatter diagram; and performing comprehensive analysis and determining on the temperature gradient distribution curve, the temperature gradient distribution matrix of the to-be-diagnosed porcelain insulator strings, and the scatter diagram, to complete detection of the to-be-diagnosed porcelain insulator string.

The preprocessing the collected infrared thermogram of the to-be-diagnosed porcelain insulator string specifically includes background subtraction, image denoising, and image enhancement.

The calculating a temperature gradient value of each insulator in the to-be-diagnosed porcelain insulator string specifically includes:

numbering, starting from a wire side, each insulator in the to-be-diagnosed porcelain insulator string, where the $1^{st}$ insulator close to the wire side is numbered 1, and other insulators are numbered by analogy; and calculating a temperature gradient value of the $n^{th}$ insulator according to the following formula:

$$|\nabla T_n| = \beta \cdot \frac{T_{n+1} - T_n}{T_n + 273.15° \text{ C.}}$$

In the foregoing formula, $\beta$ represents a scaling factor, $\nabla T_1$ represents a temperature change gradient between two adjacent insulators, $T_{n+1}$ represents temperature of an iron cap of the $(n+1)^{th}$ insulator, $T_n$ represents temperature of an iron cap of the $n^{th}$ insulator, M is the number of insulators in the to-be-diagnosed porcelain insulator string, and n=1, 2, 3, . . . , M−1.

A value of the scaling factor $\beta$ is 1000.

The correlation coefficient of the temperature gradient distribution curve and the correlation coefficient of the average-value curve are specifically calculated for each insulator string according to the following formula:

$$CORREL = \frac{Cov(X, Y)}{\sqrt{Var[X]Var[Y]}}$$

In the foregoing formula, Cov(X,Y) represents a covariance of a variable X and a variable Y, Var[X] represents a variance of X, and Var[Y] represents a variance of Y, in other words, $$CORREL = \frac{\sum_{i=1}^{n}(x_i - \bar{x})(y_i - \bar{y})}{\sqrt{\sum_{i=1}^{n}(x_i - \bar{x})^2 \sum_{i=1}^{n}(y_i - \bar{y})^2}}$$

where $x_i$ represents a sentinel value of the variable X, and i=1, 2, . . . , n; and $\bar{x}$ represents an average value of the variable X;

$y_i$ represents a sentinel value of the variable Y, and i=1, 2, . . . , n; and $\bar{y}$ represents an average value of the variable Y; and when the correlation coefficient of the temperature gradient distribution curve is calculated, values of the variable X and the variable Y are obtained from the temperature gradient distribution curve; when the correlation coefficient of the average-value curve is calculated, the values of the variable X and the variable Y are obtained from the average-value curve.

The performing comprehensive analysis and determining on the temperature gradient distribution curve, the temperature gradient distribution matrix of the to-be-diagnosed porcelain insulator strings, and the scatter diagram includes: determining based on a threshold of a temperature difference between iron caps, and determining based on correlation coefficients of a porcelain insulator.

The determining based on a threshold of a temperature difference between iron caps includes: obtaining an absolute value of a temperature difference between insulators in each insulator string based on the temperature gradient distribution curve corresponding to the insulator string, and screening all the insulator strings according to the standard DL/T 664-2016 to determine whether there is any low-value or zero-value insulator whose absolute value of a temperature difference is greater than 1K.

The determining based on correlation coefficients of a porcelain insulator includes:

when a temperature gradient distribution curve of an insulator string contains a local sudden change, determining that an insulator corresponding to a position of the sudden change is a deteriorated insulator;

when a temperature gradient distribution curve of an insulator string contains no local sudden change, determining that all insulators in the insulator string are normal;

for an insulator string in which an absolute value of a temperature difference between insulators not at the end of the insulator string ranges from 0.3K to 1K, calculating correlation coefficients; and if the correlation coefficients constitute a strong correlation coefficient cluster and a weak correlation coefficient cluster, and a minimum distance between the two clusters is not less than 0.4, determining that the insulator string contains a deteriorated insulator; or for an insulator string in which an absolute value of a temperature difference between insulators not at the end of the insulator string is less than 0.3K, calculating correlation coefficients; and if the correlation coefficients are centralized in a scattered manner on the whole, are greater than 0.8, and constitute a strong correlation coefficient cluster, determining that the insulator string contains no deteriorated insulator.

As shown in FIG. 2, an infrared zero value diagnosis system for a porcelain insulator string includes:

an infrared-thermogram collection module, configured to collect an infrared thermogram of a to-be-diagnosed porcelain insulator string;

an infrared-thermogram preprocessing module, configured to preprocess the collected infrared thermogram of the to-be-diagnosed porcelain insulator string, and extract temperature of an iron cap of each insulator in the infrared thermogram of the to-be-diagnosed porcelain insulator string;

a temperature gradient value calculation module, configured to calculate a temperature gradient value of each insulator in the to-be-diagnosed porcelain insulator string;

a curve drawing module, configured to draw a temperature gradient distribution curve and an average-value curve;

a correlation coefficient calculation module, configured to calculate a correlation coefficient of the temperature gradient distribution curve and a correlation coefficient of the average-value curve for each insulator string;

a presentation module, configured to present the temperature gradient distribution curve, the average-value curve, and a scatter diagram of the correlation coefficients; and an analysis and determining module, configured to perform comprehensive analysis and determining on the temperature gradient distribution curve, a temperature gradient distribution matrix of to-be-diagnosed porcelain insulator strings, and the scatter diagram, to complete detection of the to-be-diagnosed porcelain insulator string.

In another preferred embodiment, the infrared zero value diagnosis system for a porcelain insulator string in the foregoing embodiment includes a processor. The processor is configured to execute the following program modules stored in a memory: an infrared-thermogram collection module, configured to collect an infrared thermogram of a to-be-diagnosed porcelain insulator string; an infrared-thermogram preprocessing module, configured to preprocess the collected infrared thermogram of the to-be-diagnosed porcelain insulator string, and extract temperature of an iron cap of each insulator in the infrared thermogram of the to-be-diagnosed porcelain insulator string; a temperature gradient value calculation module, configured to calculate a temperature gradient value of each insulator in the to-be-diagnosed porcelain insulator string; a curve drawing module, configured to draw a temperature gradient distribution curve and an average-value curve; a correlation coefficient calculation module, configured to calculate a correlation coefficient of the temperature gradient distribution curve and a correlation coefficient of the average-value curve for each insulator string; a presentation module, configured to present the temperature gradient distribution curve, the average-value curve, and a scatter diagram of the correlation coefficients; and an analysis and determining module, configured to perform comprehensive analysis and determining on the temperature gradient distribution curve, a temperature gradient distribution matrix of to-be-diagnosed porcelain insulator strings, and the scatter diagram, to complete detection of the to-be-diagnosed porcelain insulator string.

Embodiment

Figure 3:
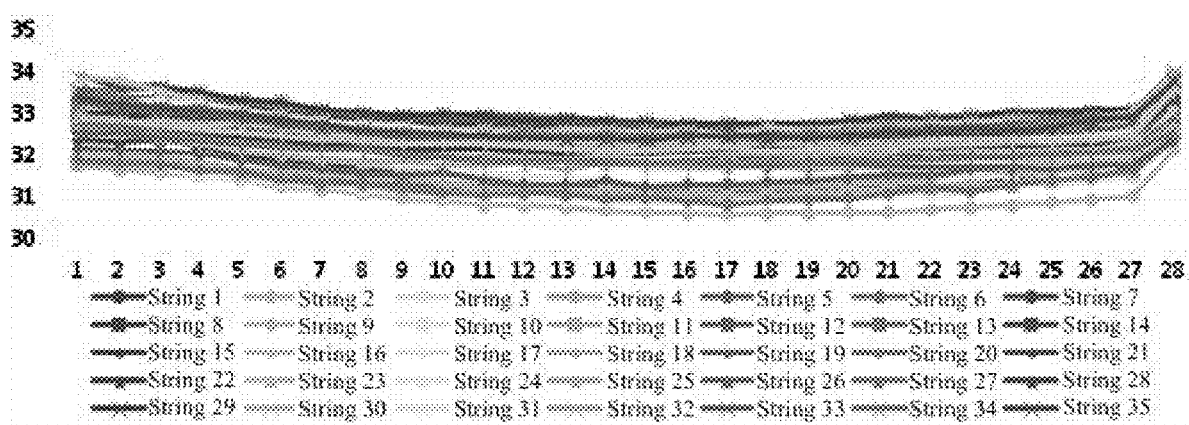
FIG. 3 shows a temperature distribution curve of a normal insulator string according to the present disclosure.
Figure 4:
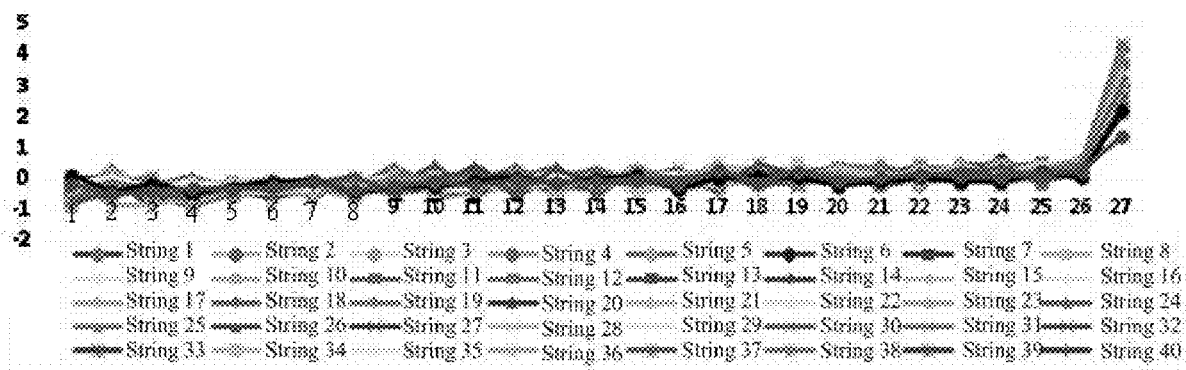
FIG. 4 shows temperature gradient distribution of a normal insulator string according to the present disclosure.
Figure 5:
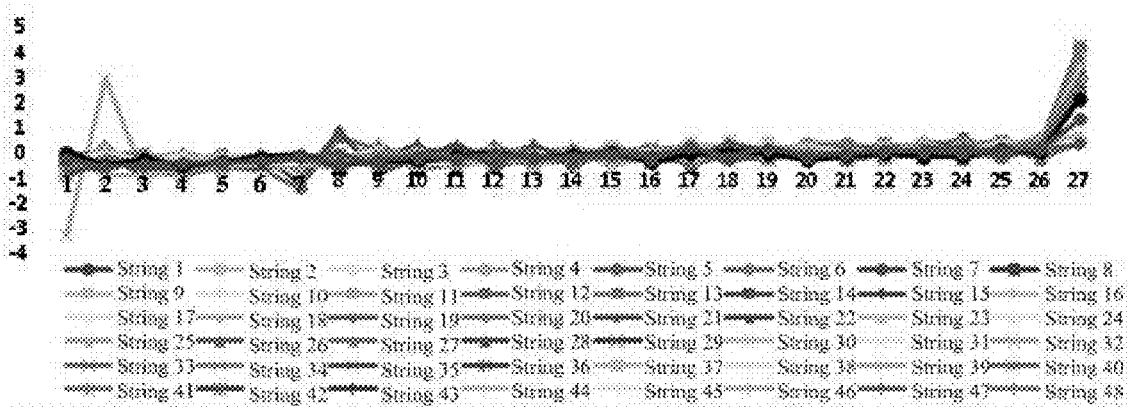
FIG. 5 shows a temperature gradient distribution of an insulator string containing a zero-value insulator according to the present disclosure.
Figure 6:
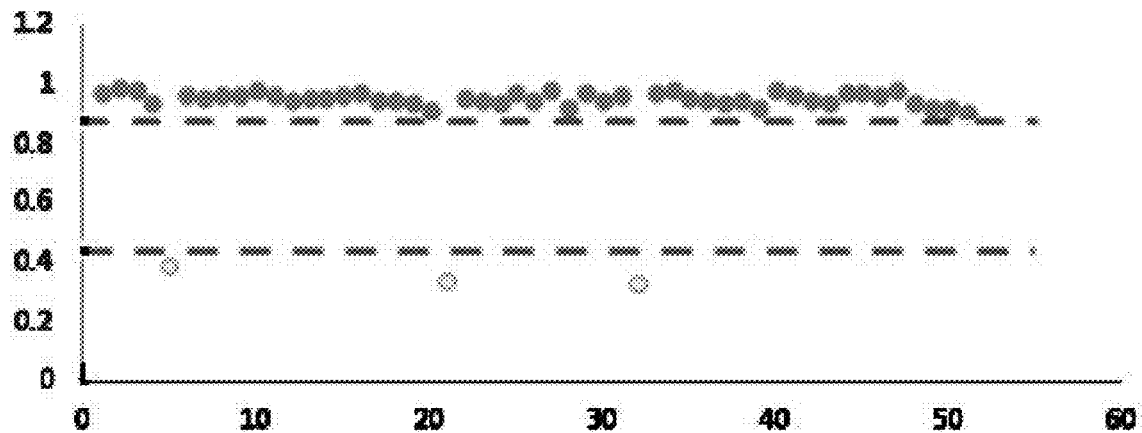
FIG. 6 shows a scatter diagram of correlation coefficients of a to-be-diagnosed insulator string according to an embodiment of the present disclosure.

Insulator strings in a 500 kV transformer substation are detected by an infrared thermogram-based infrared detection method for a porcelain cap and pin insulator. Each insulator string includes 28 insulators of a same model. A diagnosis process includes the following steps:

collecting an infrared thermogram of a to-be-diagnosed insulator string, where FIG. 3 shows a temperature distribution curve of a normal insulator string, and FIG. 4 shows temperature gradient distribution of the normal insulator string;

screening all insulator strings according to the standard DL/T 664-2016, to determine whether there is low-value or zero-value insulator whose absolute value of a temperature difference is greater than 1K, and preprocessing the collected infrared thermogram of the insulator string by background subtraction, image denoising, image enhancement, and other algorithms; extracting temperature of an iron cap of each insulator in the infrared thermogram of the to-be-diagnosed porcelain insulator string;

calculating a temperature gradient value of the $n^{th}$ insulator in the string to generate a temperature gradient distribution matrix of all the to-be-diagnosed insulator strings, and drawing a temperature gradient distribution curve (as shown in FIG. 5); and calculating a correlation coefficient of the temperature gradient distribution curve and a correlation coefficient of an average-value curve for each insulator string, and presenting the correlation coefficients in a scatter diagram (as shown in FIG. 6).

In FIG. 5, there are large sudden changes in temperature gradient curves of three insulator strings (the $5^{th}$, $21^{st}$, and $32^{nd}$ strings), and therefore, are determined to contain deteriorated insulators.

In FIG. 6, three insulator strings (the $5^{th}$, $21^{st}$, and $32^{nd}$ strings) have small correlation coefficients, and therefore, are determined to contain deteriorated insulators.

In the present disclosure, comprehensive analysis and determining are performed based on a temperature difference between iron caps and temperature difference gradient correlation coefficients. This further improves accuracy of infrared zero value diagnosis for an insulator.

The correlation coefficient is a statistical parameter for studying a linear correlation between variables, and can be used to describe co-concurrence or co-variation of two events. A larger correlation coefficient indicates a higher correlation between variables, and a smaller correlation coefficient indicates a lower correlation between variables. A value range of the correlation coefficient is [−1, 1]. If a value of the correlation coefficient is 0, it indicates that two variables are not correlated. A correlation coefficient analysis method is widely used to many fields such as science, engineering, economics, statistics, and medicine.

Those skilled in the art should understand that the embodiments of the present disclosure may be provided as a method, a system, or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, a CD-ROM, an optical memory, and the like) that include computer-usable program codes.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, so that the instructions executed by a computer or a processor of another programmable data processing device generate an apparatus for implementing a specific function in one or more processes in the flowcharts and/or in one or more blocks in the block diagrams.

These computer program instructions may also be stored in a computer readable memory that can instruct the computer or another programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

It should be understood that although this specification is described in accordance with the implementations, not every implementation includes only one independent technical solution. Such a description is merely for the sake of clarity, and those skilled in the art should take this specification as a whole. The technical solutions in the embodiments can also be appropriately combined to form other implementations which are comprehensible for those skilled in the art.

The invention claimed is:

1. An infrared zero value diagnosis method for a porcelain insulator string, comprising the following specific steps:
    collecting an infrared thermogram of a to-be-diagnosed porcelain insulator string;
    extracting temperature of an iron cap of each insulator in the infrared thermogram of the to-be-diagnosed porcelain insulator string;
    calculating a temperature gradient value of each insulator in the to-be-diagnosed porcelain insulator string based on the temperature of the iron cap of each insulator, drawing a temperature gradient distribution curve and an average-value curve, and generating a temperature gradient distribution matrix of all to-be-diagnosed porcelain insulator strings;
    calculating a correlation coefficient of the temperature gradient distribution curve and a correlation coefficient of the average-value curve for each insulator string, and presenting the correlation coefficients in a scatter diagram; and
    performing comprehensive analysis and determining on the temperature gradient distribution curve, the temperature gradient distribution matrix of the to-be-diagnosed porcelain insulator strings, and the scatter diagram, to complete an infrared zero value diagnosis for the to-be-diagnosed porcelain insulator string.

2. The infrared zero value diagnosis method for a porcelain insulator string according to claim 1, wherein before the extracting temperature of an iron cap of each insulator in the infrared thermogram of the to-be-diagnosed porcelain insulator string, the method further comprises: performing a background subtraction, an image denoising, and an image enhancement on the collected infrared thermogram of the to-be-diagnosed porcelain insulator string.

3. The infrared zero value diagnosis method for a porcelain insulator string according to claim 1, wherein the calculating a temperature gradient value of each insulator in the to-be-diagnosed porcelain insulator string specifically comprises:
    numbering each insulator in the to-be-diagnosed porcelain insulator string, and calculating a temperature gradient value of the $n^{th}$ insulator according to the following formula:

$$|\nabla T_n| = \beta \cdot \frac{T_{n+1} - T_n}{T_n + 273.15° \text{ C.}}$$

wherein $\beta$ represents a scaling factor, $\nabla T_n$ represents a temperature change gradient between two adjacent insulators, $T_{n+1}$ represents temperature of an iron cap of the $(n+1)^{th}$ insulator, $T_n$ represents temperature of an iron cap of the $n^{th}$ insulator, M is the number of insulators in the to-be-diagnosed porcelain insulator string, and n=1, 2, 3, . . . , M−1.

4. The infrared zero value diagnosis method for a porcelain insulator string according to claim 3, wherein the numbering each insulator comprises: numbering, starting from a wire side, each insulator in the to-be-diagnosed porcelain insulator string, wherein the $1^{st}$ insulator close to the wire side is numbered 1, and other insulators are numbered by analogy.

5. The infrared zero value diagnosis method for a porcelain insulator string according to claim 3, wherein a value of the scaling factor $\beta$ is 1000.

6. The infrared zero value diagnosis method for a porcelain insulator string according to claim 1, wherein the correlation coefficient of the temperature gradient distribution curve and the correlation coefficient of the average-value curve are specifically calculated for each insulator string according to the following formula:

$$CORREL = \frac{\text{Cov}(X, Y)}{\sqrt{\text{Var}[X]\text{Var}[Y]}}$$

wherein Cov(X,Y) represents a covariance of a variable X and a variable Y, Var[X] represents a variance of X, and Var[Y] represents a variance of Y, in other words, $$CORREL = \frac{\sum_{i=1}^{n}(x_i - \overline{x})(y_i - \overline{y})}{\sqrt{\sum_{i=1}^{n}(x_i - \overline{x})^2 \sum_{i=1}^{n}(y_i - \overline{y})^2}}$$

wherein $x_i$ represents a sentinel value of the variable X, and i=1, 2, ..., n; and $\overline{x}$ represents an average value of the variable X;

$y_i$ represents a sentinel value of the variable Y, and i=1, 2, ..., n; and $\overline{y}$ represents an average value of the variable Y; and when the correlation coefficient of the temperature gradient distribution curve is calculated, values of the variable X and the variable Y are obtained from the temperature gradient distribution curve; when the correlation coefficient of the average-value curve is calculated, the values of the variable X and the variable Y are obtained from the average-value curve.

7. The infrared zero value diagnosis method for a porcelain insulator string according to claim 1, wherein the comprehensive analysis and determining comprises:
   determining based on a threshold of a temperature difference between iron caps, and determining based on correlation coefficients of a porcelain insulator.

8. The infrared zero value diagnosis method for a porcelain insulator string according to claim 7, wherein the determining based on a threshold of a temperature difference between iron caps comprises: obtaining an absolute value of a temperature difference between insulators in each insulator string based on the temperature gradient distribution curve corresponding to the insulator string, and screening all the insulator strings to determine whether there is any low-value or zero-value insulator whose absolute value of a temperature difference is greater than a threshold.

9. The infrared zero value diagnosis method for a porcelain insulator string according to claim 8, wherein the screening all the insulator strings is performed according to the standard DL/T 664-2016, and the threshold of the absolute value of the temperature difference is set to 1K according to the standard DL/T 664-2016.

10. The infrared zero value diagnosis method for a porcelain insulator string according to claim 7, wherein the determining based on correlation coefficients of a porcelain insulator comprises:
    when a temperature gradient distribution curve of an insulator string contains a local sudden change, determining that an insulator corresponding to a position of the sudden change is a deteriorated insulator;
    when a temperature gradient distribution curve of an insulator string contains no local sudden change, determining that all insulators in the insulator string are normal;
    for an insulator string in which an absolute value of a temperature difference between insulators not at the end of the insulator string ranges from 0.3K to 1K, calculating correlation coefficients; and if the correlation coefficients constitute a strong correlation coefficient cluster and a weak correlation coefficient cluster, and a minimum distance between the two clusters is not less than 0.4, determining that the insulator string contains a deteriorated insulator; or
    for an insulator string in which an absolute value of a temperature difference between insulators not at the end of the insulator string is less than 0.3K, calculating correlation coefficients; and if the correlation coefficients are centralized in a scattered manner on the whole, are greater than 0.8, and constitute a strong correlation coefficient cluster, determining that the insulator string contains no deteriorated insulator.

11. An infrared zero value diagnosis system for a porcelain insulator string, comprising:
    an infrared-thermogram collection module configured to collect an infrared thermogram of a to-be-diagnosed porcelain insulator string;
    an infrared-thermogram preprocessing module configured to preprocess the collected infrared thermogram of the to-be-diagnosed porcelain insulator string, and extract temperature of an iron cap of each insulator in the infrared thermogram of the to-be-diagnosed porcelain insulator string;
    a temperature gradient value calculation module configured to calculate a temperature gradient value of each insulator in the to-be-diagnosed porcelain insulator string;
    a curve drawing module configured to draw a temperature gradient distribution curve and an average-value curve;
    a correlation coefficient calculation module configured to calculate a correlation coefficient of the temperature gradient distribution curve and a correlation coefficient of the average-value curve for each insulator string;
    a presentation module configured to present the temperature gradient distribution curve, the average-value curve, and a scatter diagram of the correlation coefficients; and
    an analysis and determining module configured to perform comprehensive analysis and determining on the temperature gradient distribution curve, a temperature gradient distribution matrix of to-be-diagnosed porcelain insulator strings, and the scatter diagram, to complete detection of the to-be-diagnosed porcelain insulator string.

* * * * *